United States Patent
Ikeda

(10) Patent No.: US 12,243,903 B2
(45) Date of Patent: Mar. 4, 2025

(54) RADIATION DETECTOR, RADIATION CT APPARATUS, AND METHOD OF MANUFACTURING RADIATION DETECTOR

(71) Applicant: CANON KABUSHIKI KAISHA, Tokyo (JP)

(72) Inventor: Takashi Ikeda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 163 days.

(21) Appl. No.: 18/295,354

(22) Filed: Apr. 4, 2023

(65) Prior Publication Data
US 2024/0304651 A1    Sep. 12, 2024

(30) Foreign Application Priority Data
Mar. 7, 2023    (JP) .................................. 2023-034930

(51) Int. Cl.
| | |
|---|---|
| *H01L 27/146* | (2006.01) |
| *G01N 23/046* | (2018.01) |
| *G01N 23/083* | (2018.01) |
| *G01T 1/24* | (2006.01) |
| *H01L 23/544* | (2006.01) |

(52) U.S. Cl.
CPC ..... *H01L 27/14661* (2013.01); *G01N 23/046* (2013.01); *G01N 23/083* (2013.01); *G01T 1/247* (2013.01); *H01L 23/544* (2013.01); *H01L 27/14659* (2013.01); *H01L 27/1469* (2013.01); *H01L 2223/54426* (2013.01)

(58) Field of Classification Search
CPC ............. H01L 27/14661; H01L 23/544; H01L 27/14659; H01L 27/1469; H01L 2223/54426; H01L 27/14634; H01L 27/14636; G01N 23/046; G01N 23/083; G01T 1/247; G01T 1/244
See application file for complete search history.

(56) References Cited

U.S. PATENT DOCUMENTS

| 8,283,183 B2 | 10/2012 | Ikeda |
| 2017/0186800 A1 | 6/2017 | Ikeda |

(Continued)

FOREIGN PATENT DOCUMENTS

| JP | 2016-40524 A | 3/2016 |
| JP | 2021-192438 A | 12/2021 |

(Continued)

*Primary Examiner* — Kiho Kim
(74) *Attorney, Agent, or Firm* — VENABLE LLP

(57) ABSTRACT

A radiation detector in which a semiconductor substrate to convert radiation into charges, a circuit board comprising a readout circuit to read out signals from pixels arranged on the substrate, and a bonding layer to bond the substrate and the circuit board are stacked is provided. Each of the pixels comprises an electrode arranged on a first surface on a side of the circuit board of the substrate. The readout circuit is arranged on a second surface on a side of the substrate of the circuit board, and is connected to a conductive pattern arranged on a third surface on an opposite side of the second surface of the circuit board. The electrode is electrically connected to the readout circuit via the conductive pattern and a second conductive member arranged in a through hole penetrating the circuit board and the bonding layer.

18 Claims, 8 Drawing Sheets

(56) References Cited

U.S. PATENT DOCUMENTS

2021/0084249 A1    3/2021  Nakazawa
2021/0175286 A1*   6/2021  Park .................. H01L 27/14621
2022/0165767 A1    5/2022  Fujii

FOREIGN PATENT DOCUMENTS

WO    2019/131965 A1    7/2019
WO    2020/170936 A1    8/2020

* cited by examiner

F I G. 6A
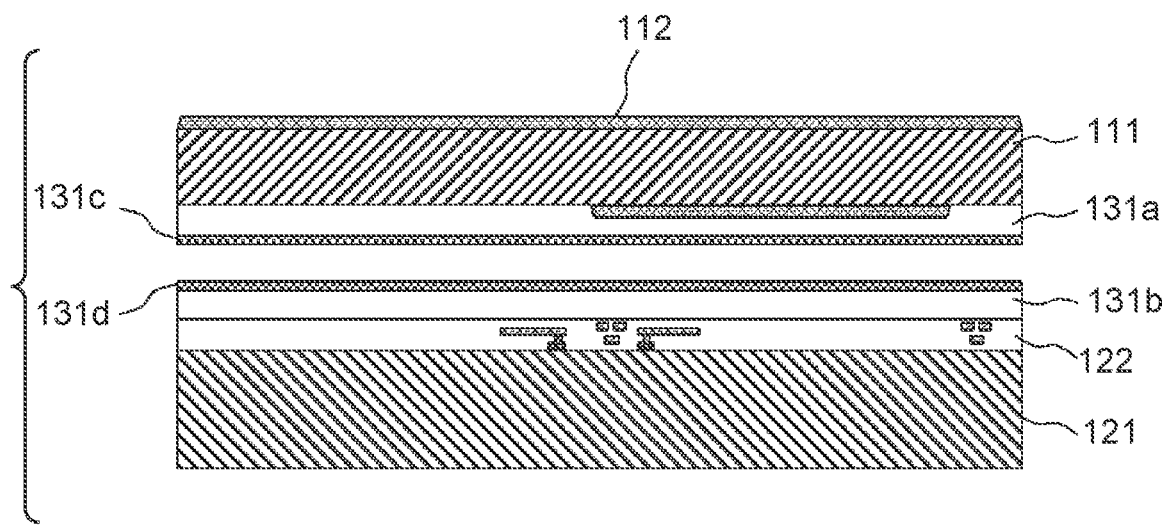
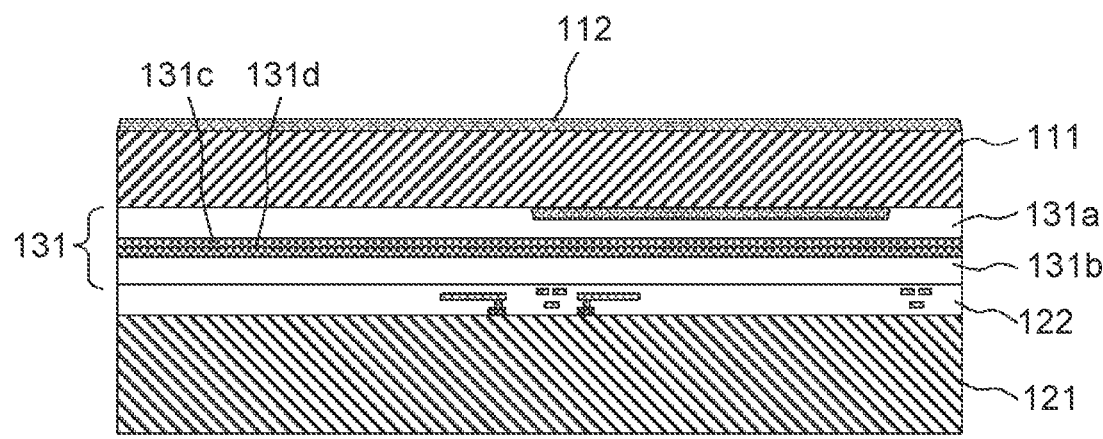
F I G. 6B

RADIATION DETECTOR, RADIATION CT APPARATUS, AND METHOD OF MANUFACTURING RADIATION DETECTOR

BACKGROUND OF THE INVENTION

Field of the Invention

The present invention relates to a radiation detector, a radiation CT apparatus, and a method of manufacturing the radiation detector.

Description of the Related Art

There is known that a semiconductor substrate which converts incident radiation into charges is used for a radiation detector. Japanese Patent Laid-Open No. 2016-040524 describes that an integrated circuit board and a semiconductor substrate using cadmium telluride or cadmium zinc telluride are connected via bumps of gold, solder, or the like.

In a radiation detector that electrically connects a semiconductor substrate and a circuit board, the bonding strength between the semiconductor substrate and the circuit board is important in terms of the reliability of the radiation detector.

Some embodiments of the present invention provide a technique advantageous in improving the reliability of a radiation detector.

SUMMARY OF THE INVENTION

According to some embodiments, a radiation detector in which a semiconductor substrate configured to convert incident radiation into charges, a circuit board on which a readout circuit configured to read out signals generated by a plurality of pixels arranged on the semiconductor substrate is arranged, and a bonding layer arranged between the semiconductor substrate and the circuit board and configured to bond the semiconductor substrate and the circuit board are stacked on each other, wherein each of the plurality of pixels comprises an electrode arranged on a first surface on a side of the circuit board out of two principal surfaces of the semiconductor substrate, the readout circuit is arranged on a second surface on a side of the semiconductor substrate out of two principal surfaces of the circuit board, and is electrically connected, via a first conductive member penetrating the circuit board, to a conductive pattern arranged on a third surface on an opposite side of the second surface out of the two principal surfaces, and the electrode is electrically connected to the readout circuit via the conductive pattern and a second conductive member arranged in a through hole penetrating the circuit board and the bonding layer, is provided.

According to some other embodiments, a method of manufacturing a radiation detector in which a semiconductor substrate, on which a plurality of pixels are arranged, configured to convert incident radiation into charges, a circuit board on which a readout circuit configured to read out signals generated by the plurality of pixels is arranged, and a bonding layer arranged between the semiconductor substrate and the circuit board and configured to bond the semiconductor substrate and the circuit board are stacked on each other, wherein each of the plurality of pixels includes an electrode arranged on a first surface out of two principal surfaces of the semiconductor substrate, the electrodes and the first surface of the semiconductor substrate are covered with a first bonding layer of the bonding layer, the readout circuit is arranged on a second surface out of two principal surfaces of the circuit board, the readout circuit and the second surface of the circuit board are covered with a second bonding layer of the bonding layer, and the method comprises: stacking the semiconductor substrate and the circuit board on each other by bonding the first bonding layer and the second bonding layer using a surface activated bonding method; and electrically connecting the electrodes to the readout circuit after stacking the semiconductor substrate and the circuit board on each other, is provided.

Further features of the present invention will become apparent from the following description of exemplary embodiments (with reference to the attached drawings).

BRIEF DESCRIPTION OF THE DRAWINGS

FIGS. 6A and 6B are views showing a modification of the radiation detector shown in FIG. 1;

DESCRIPTION OF THE EMBODIMENTS

Figure 1:
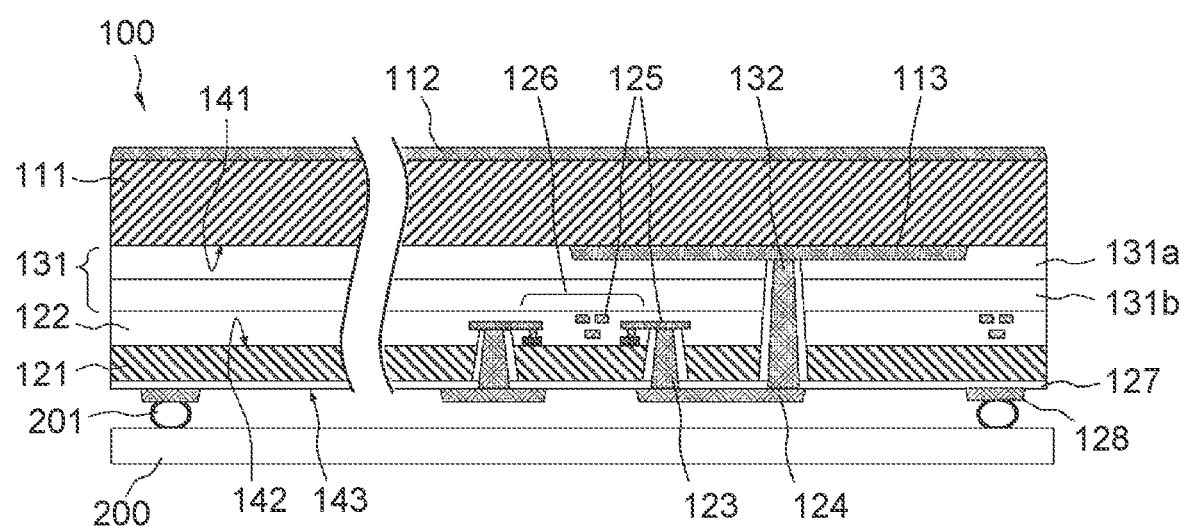
FIG. 1 is a view showing an example of the arrangement of a radiation detector according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Radiation according to the present invention can include not only α-rays, β-rays, and γ-rays that are beams generated by particles (including photons) emitted by radioactive decay but also beams having equal or more energy, for example, X-rays, particle rays, and cosmic rays.

A radiation detector according to an embodiment of the present invention will be described with reference to FIGS. 1 to 8. FIG. 1 is a view showing an example of the arrangement of a radiation detector 100 according to this embodiment. The radiation detector 100 has a structure in which a semiconductor substrate 111 that converts incident radiation into charges, a circuit board 121 on which a readout circuit 126 for reading out signals generated by a plurality of pixels arranged on the semiconductor substrate 111 is arranged, and a bonding layer 131 that is arranged between the semiconductor substrate 111 and the circuit board 121 and bonds the semiconductor substrate 111 and the circuit board 121 are stacked on each other. The radiation detector 100 is electrically connected to a mount substrate 200 for processing a signal output from the radiation detector 100. The radiation detector 100 and the mount substrate 200 may be connected by, for example, connecting terminals 128 of the radiation detector 100 and terminals (not shown) of the mount substrate 200 via bumps 201 such as solder balls, as shown in FIG. 1. That is, the radiation detector 100 is electrically connected to an external device such as the mount substrate 200 via the bumps 201 connected to the terminals 128 arranged on a surface 143 of the radiation detector 100.

Each of the plurality of pixels arranged on the semiconductor substrate 111 includes an electrode 113 arranged on a surface 141 on the side of the circuit board 121 out of the two principal surfaces of the semiconductor substrate 111. FIG. 1 shows one electrode 113 but a plurality of electrodes 113 can be arranged, on the semiconductor substrate 111, in an array to form rows and columns. By arranging the electrodes 113, the positions of the respective pixels arranged on the semiconductor substrate 111 can be confirmed. Each of the plurality of pixels arranged on the semiconductor substrate 111 includes an electrode 112 on a surface on the opposite side of the surface 141 out of the two principal surfaces of the semiconductor substrate 111. The electrode 112 may have an integrated structure shared by the plurality of pixels, as shown in FIG. 1, or may be divided into a plurality of electrodes.

The readout circuit 126 is arranged on a surface 142 on the side of the semiconductor substrate 111 out of the two principal surfaces of the circuit board 121. The readout circuit 126 is electrically connected, via a conductive member 123 penetrating the circuit board 121, to a conductive pattern 124 arranged on the surface 143 on the opposite side of the surface 142 out of the two principal surfaces of the circuit board 121. Each electrode 113 arranged on the semiconductor substrate 111 is electrically connected to the readout circuit 126 via the above-described conductive pattern 124 and a conductive member 132 arranged in a through hole penetrating the circuit board 121 and the bonding layer 131. This can read out, from the electrodes 113, signals generated by the pixels arranged on the semiconductor substrate 111.

Figure 2A:
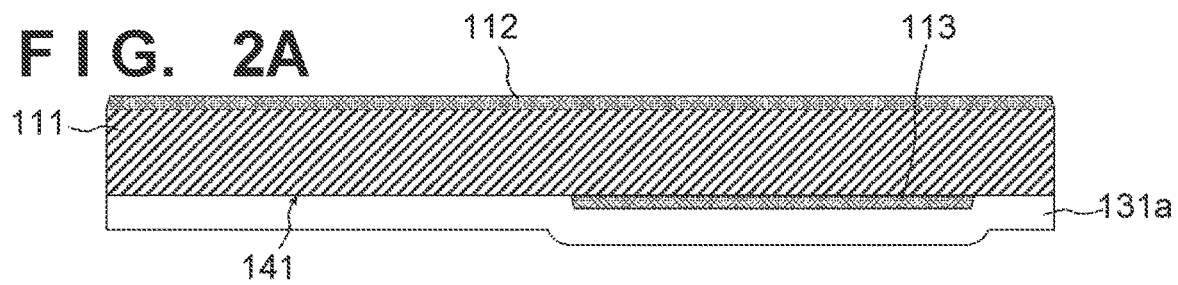
FIGS. 2A to 2D are views showing a method of manufacturing the radiation detector shown in FIG. 1.

Next, a method of manufacturing the radiation detector 100 will be described with reference to FIGS. 2A to 4C. As shown in FIG. 2A, the electrodes 112 and 113 are formed on the semiconductor substrate 111. For the semiconductor substrate 111, cadmium telluride (CdTe), cadmium zinc telluride (CdZnTe), lead iodide (PbI$_2$), mercury iodide (HgI$_2$), bismuth iodide (BiI$_3$), thallium bromide (TlBr), or the like that converts incident radiation into charges is used. The semiconductor substrate 111 may be a single crystal substrate using one of these semiconductor materials. The thickness of the semiconductor substrate 111 may be 3 mm or less. Assuming acquisition of a radiation image using soft X-rays having energy of 100 keV or less such as an area sensor, baggage inspection, or X-ray imaging, CdTe or CdZnTe can sufficiently absorb soft X-rays as long as the thickness is at least 3 mm. In addition, PbI$_2$, HgI$_2$, BiI$_3$, and TlBr each have absorptance of soft X-rays higher than that of CdTe or CdZnTe.

Figure 2B:
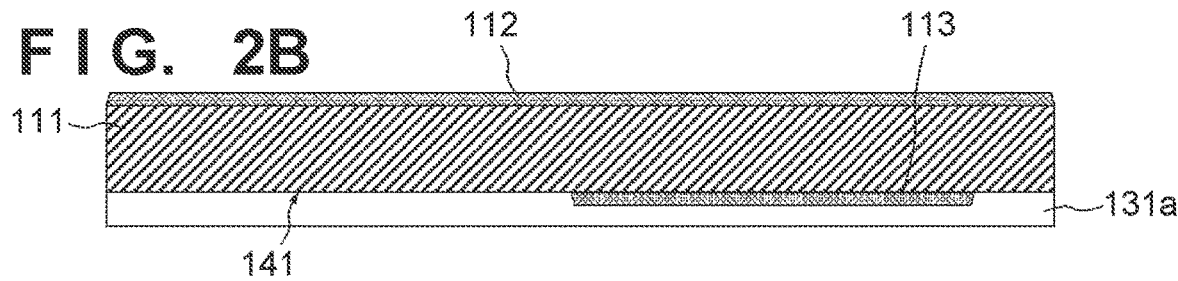

The electrodes 113 and the surface 141 of the semiconductor substrate 111 are covered with a bonding layer 131a of a layer that serves as the bonding layer 131 for bonding the semiconductor substrate 111 and the circuit board 121 in a step to be described later. For the bonding layer 131a, for example, an insulating material such as silicon oxide is used. The bonding layer 131a is formed by depositing silicon oxide or the like on the surface 141 of the semiconductor substrate 111 on which the electrodes 113 are formed, and planarizing unevenness caused by the arrangement of the electrodes 113, as shown in FIG. 2B.

Next, the circuit board 121 to be bonded to the semiconductor substrate 111 is prepared. On the surface 142 of the circuit board 121 facing the semiconductor substrate 111, the readout circuit 126 is formed, as described above. On the surface 142 of the circuit board 121, a wiring layer 122 including wiring patterns 125 connected to the readout circuit 126 is arranged. The readout circuit 126 (and the wiring layer 122) and the surface 142 of the circuit board 121 are covered with a bonding layer 131b of the layer that serves as the bonding layer 131 for bonding the semiconductor substrate 111 and the circuit board 121 in the step to be described later. For the bonding layer 131b, for example, an insulating material such as silicon oxide is used.

Figure 2C:
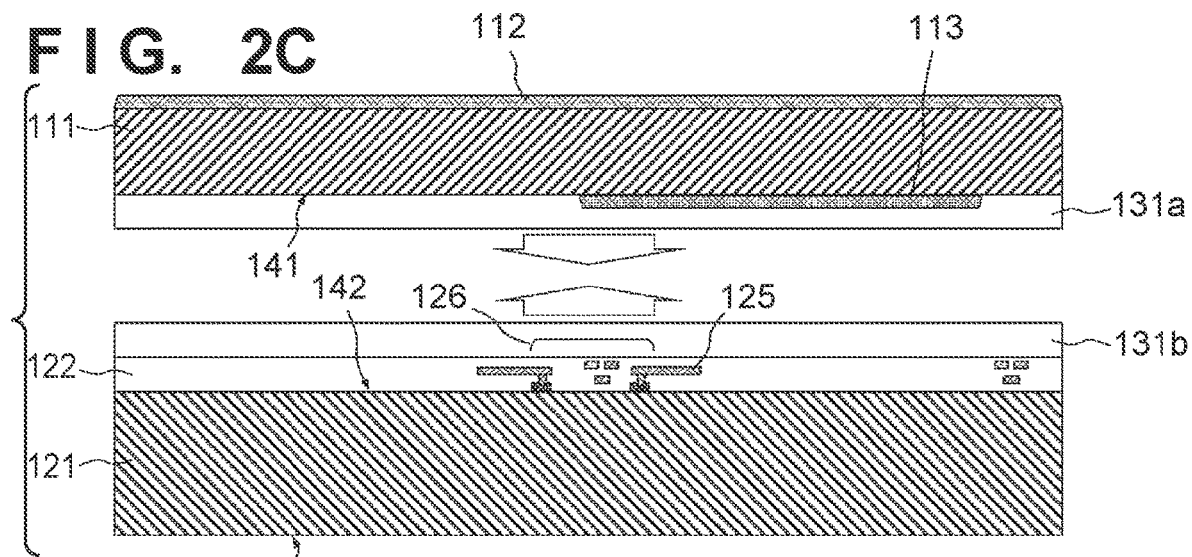

Next, as shown in FIG. 2C, a step of stacking the semiconductor substrate 111 and the circuit board 121 by bonding the bonding layers 131a and 131b to each other is performed. The semiconductor substrate 111 and the circuit board 121 are bonded to each other while being aligned using alignment marks provided on the semiconductor substrate 111 and the circuit board 121. For the circuit board 121 on which the readout circuit 126 is formed, a semiconductor substrate using a material such as silicon different from that of the semiconductor substrate 111 is used. In this embodiment, silicon is used for the circuit board 121. Since silicon transmits infrared light, the alignment mark may be arranged on either of the surfaces 142 and 143 of the circuit board 121. Meanwhile, since CdTe or CdZnTe used for the semiconductor substrate 111 is thick, if the alignment mark is arranged on the surface on the opposite side of the surface 141, the visibility of the alignment mark lowers when infrared light is emitted from the side of the surface 141 of the semiconductor substrate 111. To cope with this, the alignment mark used to align the semiconductor substrate 111 and the circuit board 121 is arranged on the surface 141 of the semiconductor substrate 111. By arranging the alignment mark on the surface 141 of the semiconductor substrate 111 and emitting infrared light from the side of the circuit board 121, the semiconductor substrate 111 and the circuit board 121 can be aligned when they are bonded to each other.

Figure 2D:
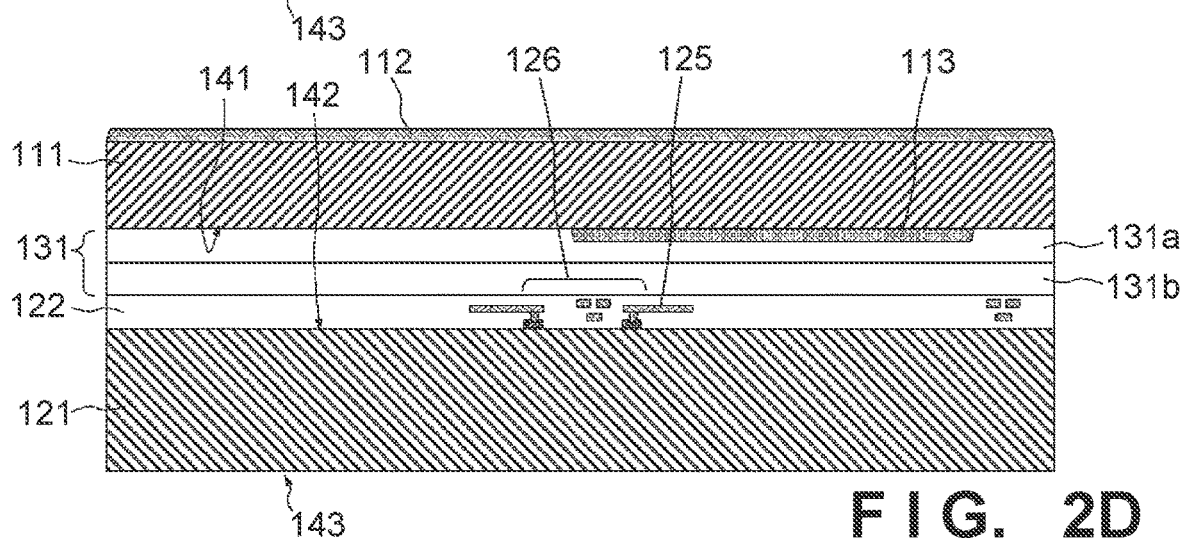

To bond the semiconductor substrate 111 and the circuit board 121, more specifically, to bond the bonding layers 131a and 131b, for example, a surface activated bonding method can be used. The surface activated bonding method is a method of bonding the bonding layers 131a and 131b by irradiating, with plasma, the surfaces of the bonding layer 131a covering the semiconductor substrate 111 and the bonding layer 131b covering the circuit board 121 to activate the surfaces of the bonding layers 131a and 131b. If the surface activated bonding method is used, the semiconductor substrate 111 and the circuit board 121 can be bonded to each other, as shown in FIG. 2D, at a relatively low temperature such as room temperature.

As described in Japanese Patent Laid-Open No. 2016-040524, consider a case in which the semiconductor substrate 111 and the circuit board 121 are bonded to each other using bumps of gold, solder, or the like. In this case, when bumps are heated to melt to bond the semiconductor substrate 111 and the circuit board 121 to each other, warping or an alignment deviation may occur due to a difference between the coefficients of thermal expansion of materials respectively contained in the semiconductor substrate 111 and the circuit board 121. If the semiconductor substrate 111 or the circuit board 121 is warped, a failure in bonding between the semiconductor substrate 111 and the circuit board 121 may occur in some bumps, and the bonding strength between the semiconductor substrate 111 and the circuit board 121 may decrease. In addition, in this case, a failure in electrical connection between the pixels arranged on the semiconductor substrate 111 and the readout circuit 126 arranged on the circuit board 121 may occur. Similarly, when an alignment deviation occurs as well, a failure in bonding between the semiconductor substrate 111 and the circuit board 121 or a failure in connection between the pixels arranged on the semiconductor substrate 111 and the readout circuit 126 arranged on the circuit board 121 may occur. A failure in bonding between the semiconductor substrate 111 and the circuit board 121 or a failure in connection between the pixels arranged on the semiconductor substrate 111 and the readout circuit 126 arranged on the circuit board 121 decreases the reliability of the radiation detector 100.

Meanwhile, in this embodiment, the semiconductor substrate 111 and the circuit board 121 are bonded to each other at a low temperature using the surface activated bonding method. Thus, it is possible to suppress occurrence of an alignment deviation or warping of the semiconductor substrate 111 or the circuit board 121. Furthermore, the semiconductor substrate 111 and the circuit board 121 are bonded at a bonding surface between the bonding layers 131a and 131b. That is, it is possible to bond the semiconductor substrate 111 and the circuit board 121 with an area wider than that when bumps are used, and the radiation detector 100 of this embodiment has a structure advantageous in improving the bonding strength between the semiconductor substrate 111 and the circuit board 121. As a result, it is possible to improve the reliability of the radiation detector 100.

Figure 5A:
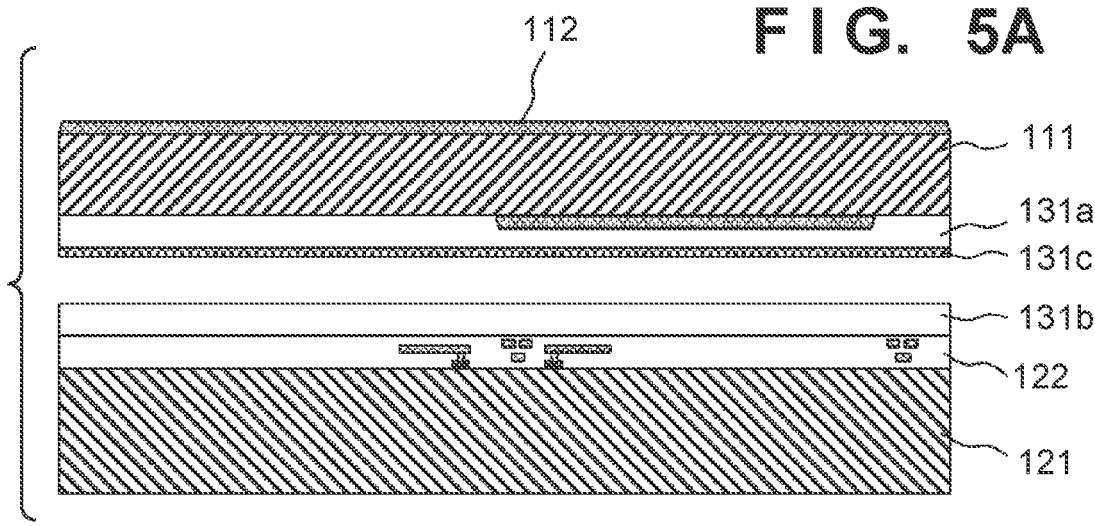
FIGS. 5A to 5C are views each showing a modification of the radiation detector shown in FIG. 1.
Figure 5B:
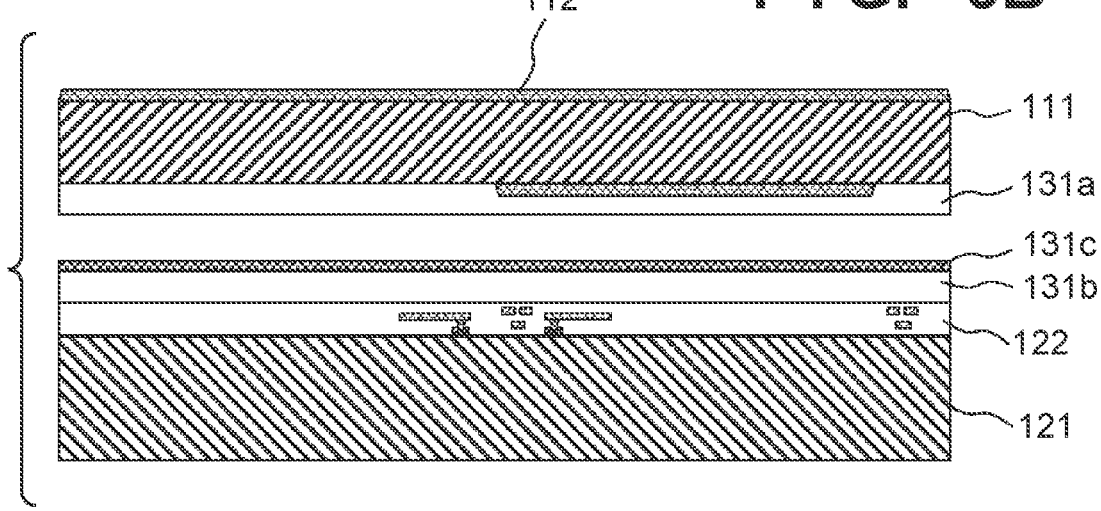
Figure 5C:
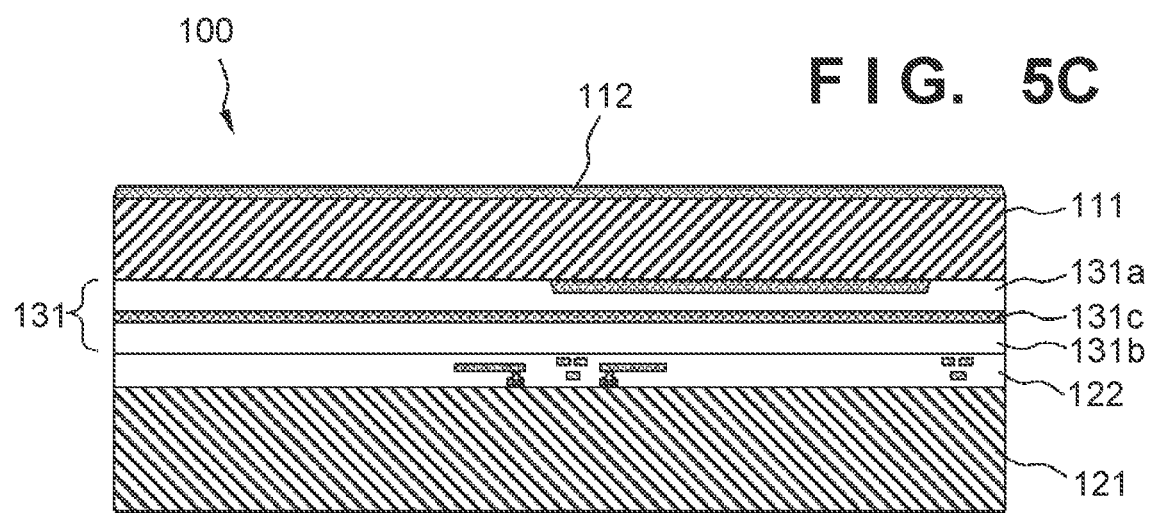

In the arrangement shown in FIG. 1, the bonding layers 131a and 131b each using an insulating material such as silicon oxide contact each other. The present invention, however, is not limited to this. To obtain firmer stable bonding between the semiconductor substrate 111 and the circuit board 121, the bonding layer 131 may include an additional bonding layer 131c arranged between the bonding layers 131a and 131b, as shown in FIG. 5C. In this case, for example, as shown in FIG. 5A, the bonding layer 131c using silicon or a metal is deposited on the bonding layer 131a which covers the semiconductor substrate 111 and uses an insulating material such as silicon oxide. Alternatively, for example, as shown in FIG. 5B, the bonding layer 131c using silicon or a metal is deposited on the bonding layer 131b which covers the circuit board 121 and uses an insulating material such as silicon oxide. As a metal used for the bonding layer 131c, aluminum, gold, or the like may be used. After that, using the surface activated bonding method, the semiconductor substrate 111 and the circuit board 121 are bonded to each other, as shown in FIG. 5C. Alternatively, for example, as shown in FIGS. 6A and 6B, the bonding layer 131c using a metal such as silicon or aluminum may be deposited on the bonding layer 131a covering the semiconductor substrate 111, a bonding layer 131d using a metal such as silicon or aluminum may be deposited on the bonding layer 131b covering the circuit board 121, and then the semiconductor substrate 111 and the circuit board 121 may be bonded to each other. The use of the arrangement shown in FIG. 5C or 6B can further improve the reliability of the radiation detector 100.

Figure 3A:
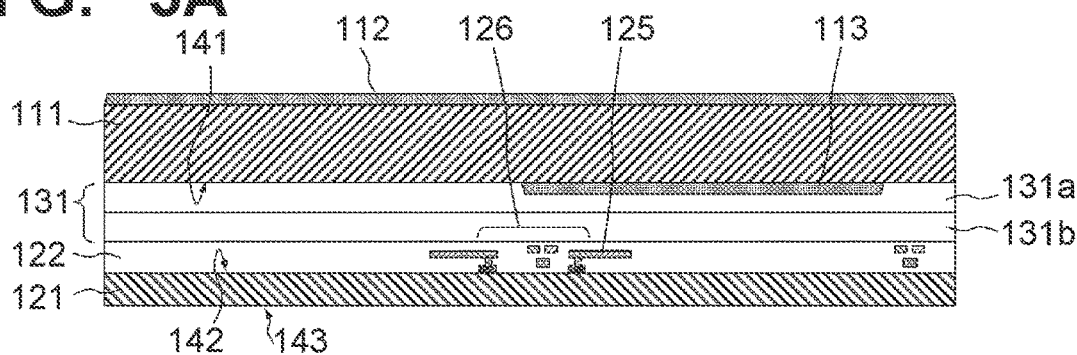
FIGS. 3A to 3D are views showing the method of manufacturing the radiation detector shown in FIG. 1.

After the semiconductor substrate 111 and the circuit board 121 are stacked on each other, a step of electrically connecting the electrodes 113 arranged on the surface 141 of the semiconductor substrate 111 to the readout circuit 126 arranged on the surface 142 of the circuit board 121 is performed. First, as shown in FIG. 3A, the circuit board 121 is thinned from the side of the surface 143. In this embodiment, the circuit board 121 using silicon can be thinned using a back grinding method, a chemical mechanical polishing method, or the like.

Figure 3B:
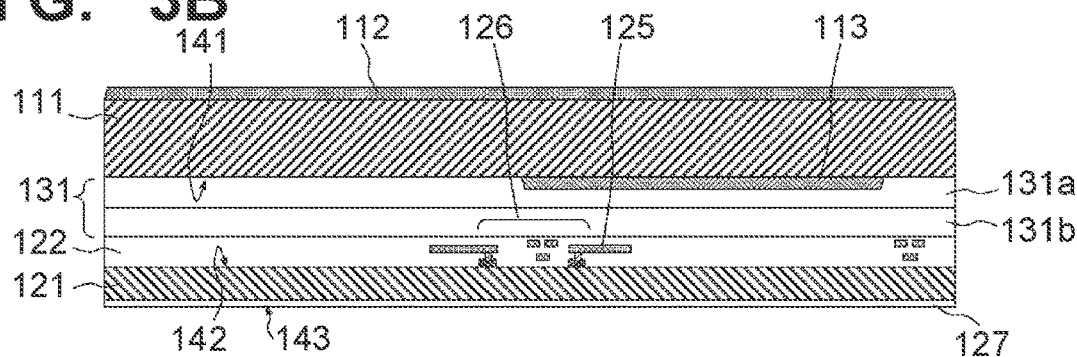
Figure 3C:
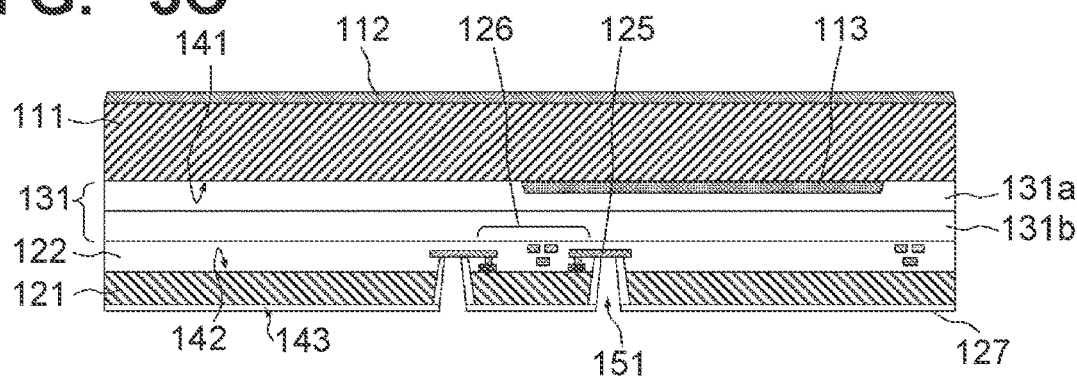
Figure 3D:
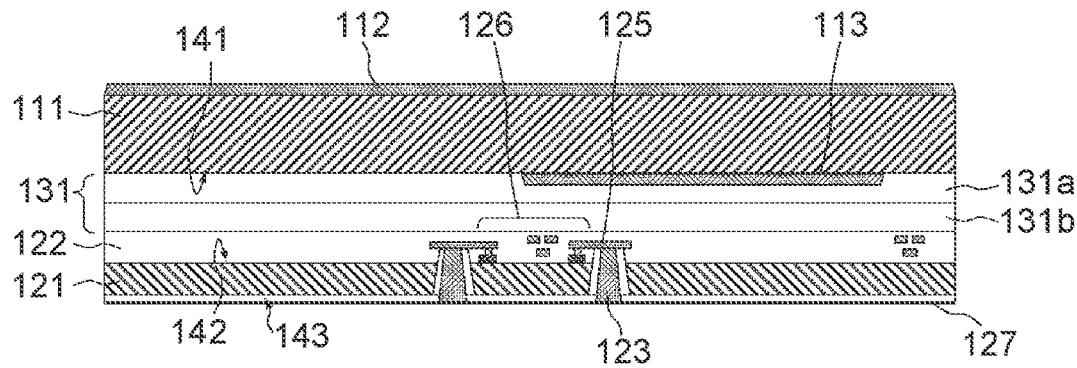

Next, as shown in FIG. 3B, a protection layer 127 is formed on the surface 143 of the circuit board 121. The protection layer 127 is formed using a material such as silicon oxide, silicon nitride, or silicon oxynitride. The protection layer 127 may have a single-layer structure or a stacked structure. After the formation of the protection layer 127, through holes 151 that penetrate the circuit board 121 and expose the wiring patterns 125 connected to the readout circuit 126 are formed. The surface of the circuit board 121 exposed by each through hole 151 can be covered with an appropriate insulating layer of silicon oxide or the like. In each through hole 151, as shown in FIG. 3D, the conductive members 123 electrically connected to the readout circuit 126 can be arranged. The conductive member 123 may have a stacked structure of a metal member and a barrier member arranged between the metal member and the surface of the through hole 151. The through holes 151 and the conductive members 123 can be formed using a known semiconductor process.

Figure 4A:
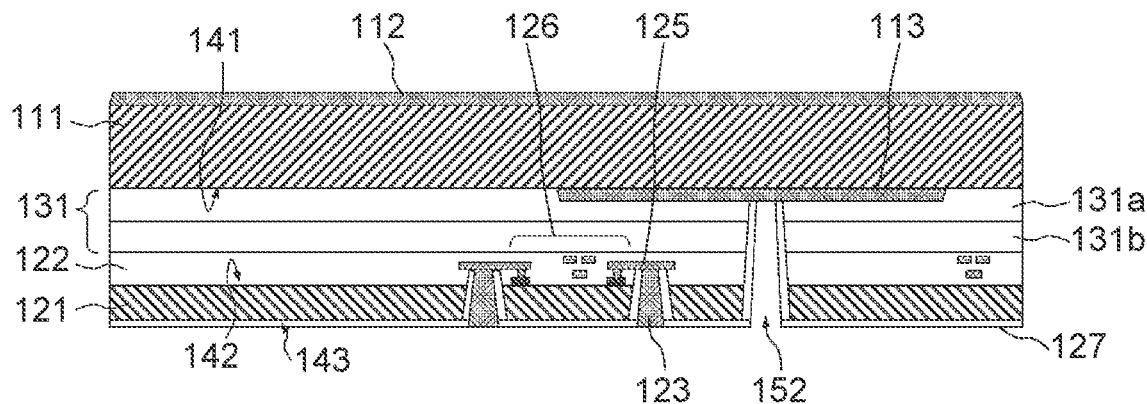
FIGS. 4A to 4C are views showing the method of manufacturing the radiation detector shown in FIG. 1.

Next, as shown in FIG. 4A, through holes 152 that penetrate the circuit board 121 and the bonding layer 131 and expose the electrodes 113 arranged on the surface 141 of the semiconductor substrate 111 are formed. The surface of the circuit board 121 exposed by each through hole 152 can be covered with an appropriate insulating layer of silicon oxide or the like. The surfaces of the bonding layer 131 and the wiring layer 122 exposed by the through holes 152 may also be covered with an insulating layer of silicon oxide or the like. If the bonding layers 131c and 131d each containing silicon or a metal are arranged, as in the arrangement shown in FIG. 5C or 6B, at least the bonding layers 131c and 131d exposed by the through holes 152 need to be covered with an insulating layer.

At this time, the thickness of the circuit board 121 may be 1.5 times or less the pitch at which the plurality of pixels are arranged. The pitch at which the plurality of pixels are arranged can be a pitch at which the electrodes 113 that can confirm the positions of the respective pixels are arranged. The pitch at which the electrodes 113 are arranged can be defined as the distance between the centers of the adjacent electrodes 113. The center of the electrode 113 can be the position of the geometric centroid of the electrode 113 in orthogonal projection to the surface 141 of the semiconductor substrate 111.

As shown in FIG. 4A, the through holes 152 penetrate the circuit board 121, the wiring layer 122, and the bonding layer 131. On the side of the surface 142 of the circuit board 121, the readout circuit 126 and the wiring patterns 125 connected to the readout circuit 126 are arranged. Thus, a space where the through hole 152 is formed for each pixel (electrode 113) is limited. The diameter of the through hole 152 may be made small to increase the aspect ratio. However, it is necessary to prevent the reliability of connection between the electrodes 113 and the readout circuit 126 from decreasing without making the manufacturing process complicated. To do this, the thickness of the circuit board 121 may be 1.5 times or less the pitch at which the plurality of pixels are arranged, as described above. For the same reason, the aspect ratio of the through hole 152 may be 5 or less. The aspect ratio can be a value obtained by dividing the depth of the through hole 152 (for example, the length from the surface 143 of the circuit board 121 to the surface 141 of the semiconductor substrate 111) by the diameter of the through hole 152 on the surface 143 of the circuit board 121.

As described above, the wiring layer 122 including the wiring patterns 125 connected to the readout circuit 126 is stacked between the circuit board 121 and the bonding layer 131. At this time, the length, to the surface 141 of the semiconductor substrate 111, from the wiring pattern closest to the surface 141 of the semiconductor substrate 111 among the wiring patterns 125 may be 100 nm or more. To form, in the step shown in FIG. 2B, without exposing the electrodes 113, the bonding layer 131a on the surface 141 of the semiconductor substrate 111 on which the electrodes 113 each having a thickness of about 20 to 30 nm are arranged, the bonding layer 131a needs to have a thickness of about 50 nm. Furthermore, to form the bonding layer 131b on the wiring layer 122 without exposing the wiring patterns 125, the bonding layer 131b needs to have a thickness of about 50 nm. Therefore, the length, to the surface 141 of the semiconductor substrate 111, from the wiring pattern closest to the surface 141 of the semiconductor substrate 111 among the wiring patterns 125 may be 100 nm or more. For the same reason, the thickness of the bonding layer 131 may be 100 nm or more.

Figure 4B:
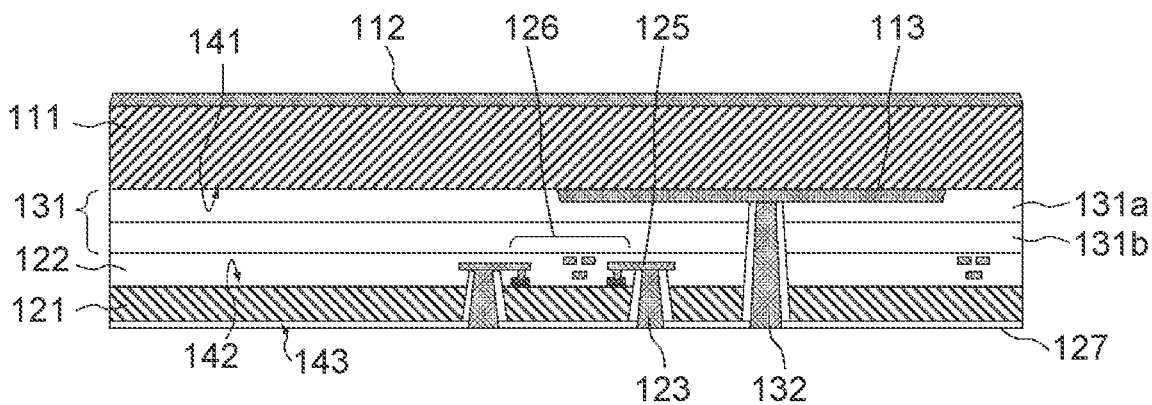

After the formation of the through holes 152, as shown in FIG. 4B, the conductive member 132 electrically connected to each electrode 113 is arranged. The conductive member 132 may have a stacked structure of a metal member and a barrier member arranged between the metal member and the surface of the through hole 152. The through holes 152 and the conductive members 132 can be formed using a known semiconductor process. This embodiment has explained the case in which after the through holes 151 and the conductive members 123 are formed, the through holes 152 and the conductive members 132 are formed but the present invention is not limited to this. After the through holes 152 and the conductive members 132 are formed, the through holes 151 and the conductive members 123 may be formed. Alternatively, depending on a process condition, the through holes 151 and 152 may be formed simultaneously, and the conductive members 123 and 132 may be formed simultaneously.

Figure 4C:
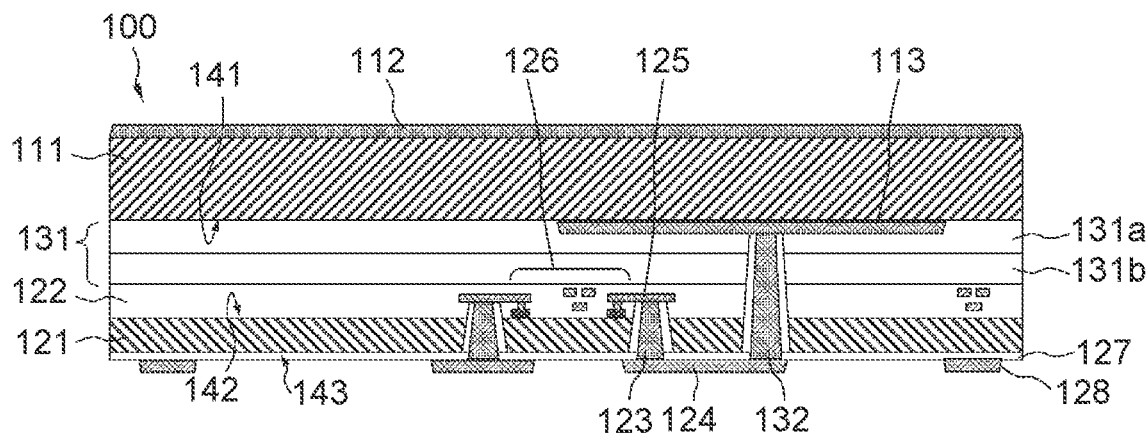

After the conductive members 123 and 132 are formed, the conductive pattern 124 that electrically connects the conductive members 123 and 132 is formed on the surface 143 of the circuit board 121. At this time, the terminals 128 for electrically connecting the radiation detector 100 to an external device such as the mount substrate 200 may be formed at the same time. Therefore, as shown in FIG. 4C, the radiation detector 100 in which the electrodes 113 arranged on the surface 141 of the semiconductor substrate 111 and the readout circuit 126 arranged on the surface 142 of the circuit board 121 are electrically connected can be obtained.

As described above, when the semiconductor substrate 111 and the circuit board 121 are bonded to each other, the bonding surface is formed between the bonding layers 131a and 131b at a low temperature using the surface activated bonding method. This can implement bonding between the semiconductor substrate 111 and the circuit board 121 with high reliability. Furthermore, after the semiconductor substrate 111 and the circuit board 121 are bonded to each other, the electrodes 113 of the pixels arranged on the semiconductor substrate 111 and the readout circuit 126 arranged on the circuit board 121 are electrically connected. The reliability of the radiation detector 100 can be improved using the above-described steps.

Figure 7A:
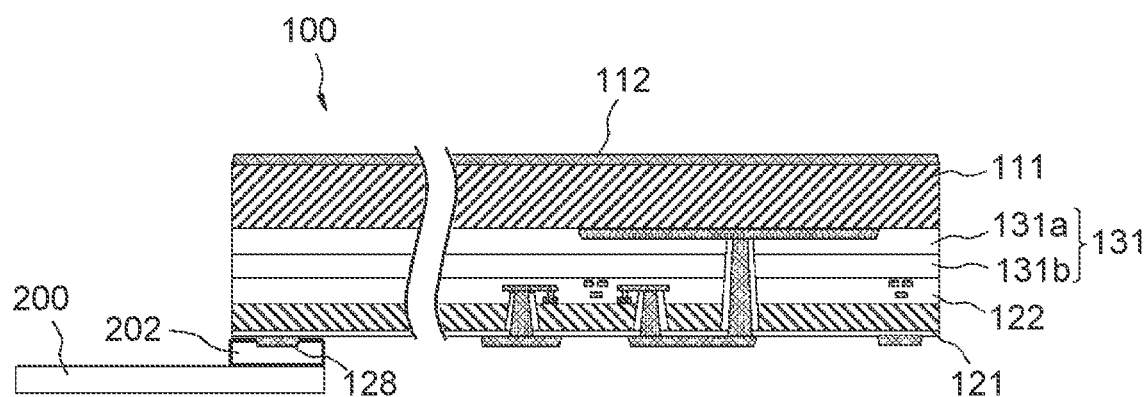
FIGS. 7A and 7B are views each showing an example of connection between a mount substrate and the radiation detector shown in FIG. 1.
Figure 7B:
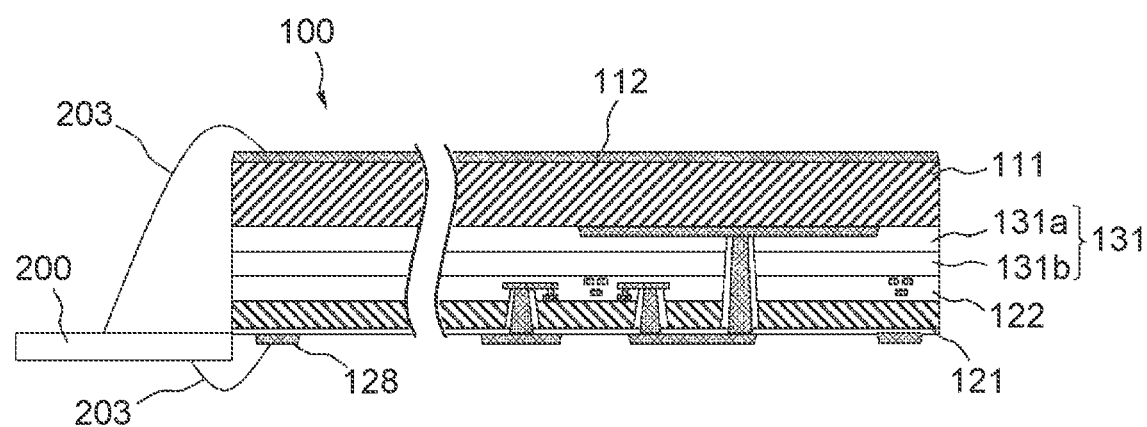

The signals read out, by the readout circuit 126 arranged on the circuit board 121, from the pixels arranged on the semiconductor substrate 111 can undergo signal processing in the mount substrate 200. As described above with reference to FIG. 1, the radiation detector 100 and the mount substrate 200 may electrically be connected via the bumps 201. However, the present invention is not limited to this. For example, as shown in FIG. 7A, the radiation detector 100 may electrically be connected to an external device such as the mount substrate 200 via an anisotropic conductive film (ACF) 202 contacting the terminal 128 arranged on the surface 143 of the radiation detector 100. Alternatively, for example, as shown in FIG. 7B, the radiation detector 100 may electrically be connected, using a wire bonding method, to an external device such as the mount substrate 200 via a wire 203 contacting the terminal 128 arranged on the surface 143 of the radiation detector 100. Connection between the electrode 112 and the mount substrate 200 is not shown in FIG. 1 or 7A. However, for example, as shown in FIG. 7B, the electrode 112 and the mount substrate 200 may be connected via a wire 203.

Electrical connection of the radiation detector 100 to an external device using the ACF 202 or the wire 203 hardly heats the radiation detector 100 in the connecting step. A defect may occur in CdTe or CdZnTe used for the semiconductor substrate 111 in a step in which heat is applied. Therefore, when the radiation detector 100 is connected to an external device using the ACF 202 or the wire 203, it is possible to suppress a decrease in the reliability of the radiation detector 100.

Figure 8:
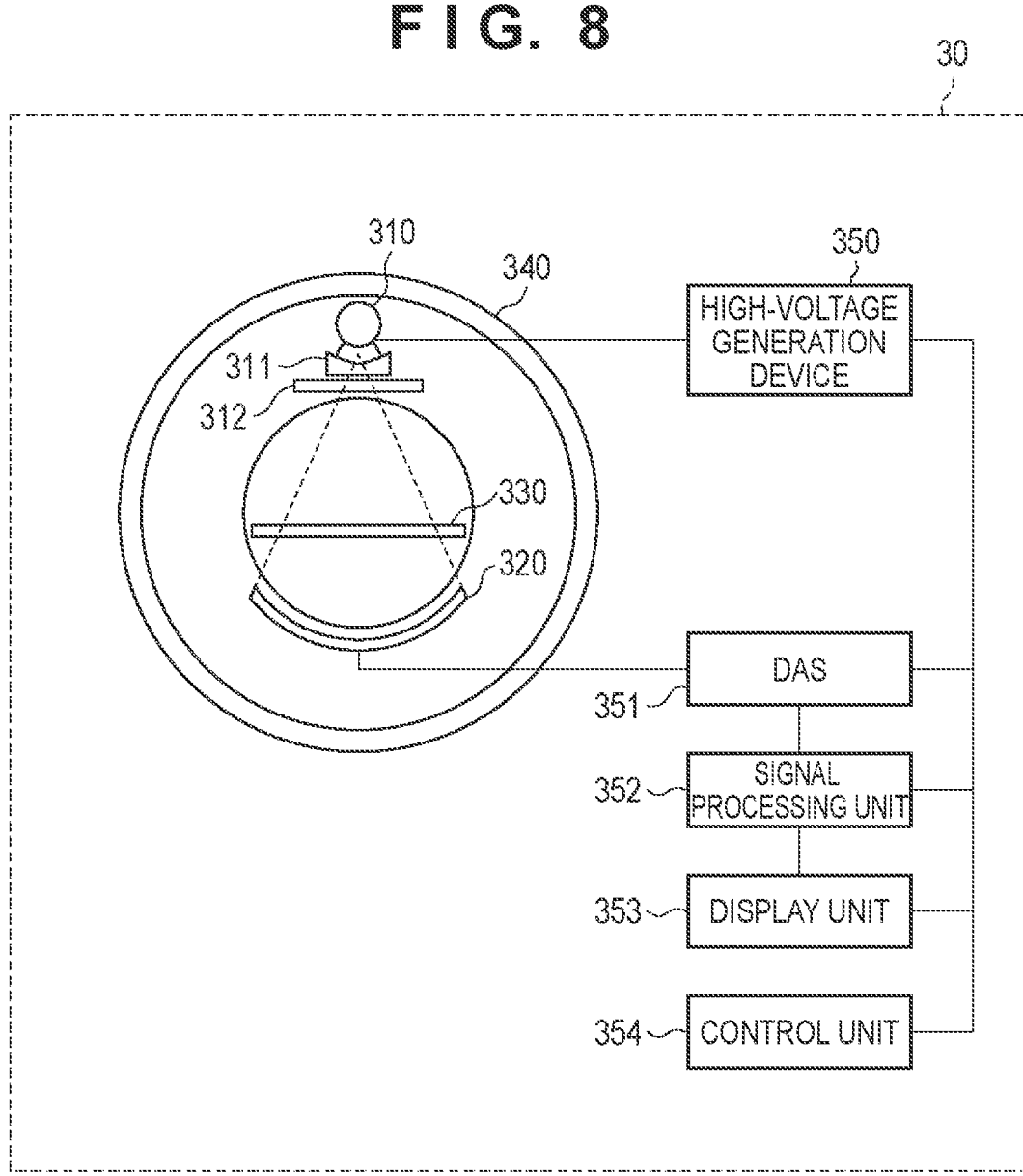
FIG. 8 is a view showing an example of the arrangement of a radiation CT apparatus using the radiation detector shown in FIG. 1.

FIG. 8 is a block diagram of a radiation CT apparatus according to this embodiment. The above-described radiation detector 100 is applicable to a detector of the radiation CT apparatus. A radiation CT apparatus 30 according to this embodiment includes a radiation generation unit 310, a wedge 311, a collimator 312, a radiation detection unit 320, a top plate 330, a rotating frame 340, a high-voltage generation device 350, a DAS (Data Acquisition System) 351, a signal processing unit 352, a display unit 353, and a control unit 354.

The radiation generation unit 310 is formed from, for example, a vacuum tube that generates X-rays. The vacuum tube of the radiation generation unit 310 is supplied with a filament current and a high voltage from the high-voltage generation device 350. When thermoelectrons are emitted from a cathode (filament) to an anode (target), X-rays are generated.

The wedge 311 is a filter that adjusts the amount of radiation emitted from the radiation generation unit 310. The wedge 311 attenuates the amount of radiation so that the radiation emitted from the radiation generation unit 310 to an object has a predetermined distribution. The collimator 312 is formed from a lead plate that narrows the irradiation range of the radiation having passed through the wedge 311. The radiation generated by the radiation generation unit 310 is formed in a cone beam shape via the collimator 312, and the object on the top plate 330 is irradiated with the radiation.

The radiation detection unit 320 is formed using the above-described radiation detector 100. The radiation detection unit 320 detects the radiation having passed through the object from the radiation generation unit 310, and outputs a signal corresponding to the amount of the radiation to the DAS 351.

The rotating frame 340 is annular, and is configured to be rotatable. The radiation generation unit 310 (the wedge 311 and the collimator 312) and the radiation detection unit 320 are arranged to face each other in the rotating frame 340. The radiation generation unit 310 and the radiation detection unit 320 can rotate together with the rotating frame 340.

The high-voltage generation device 350 includes a boosting circuit, and outputs a high voltage to the radiation generation unit 310. The DAS 351 includes an amplification circuit and an A/D conversion circuit, and outputs, as digital data, a signal from the radiation detection unit 320 to the signal processing unit 352.

The signal processing unit 352 includes a CPU (Central Processing Unit), a ROM (Read Only Memory), and a RAM (Random Access Memory), and can execute image processing and the like for the digital data. The display unit 353 includes a flat display device, and can display a radiation image. The control unit 354 includes a CPU, a ROM, and a RAM, and controls the operation of the overall radiation CT apparatus 30.

According to the present invention, it is possible to provide a technique advantageous in improving the reliability of the radiation detector.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-034930, filed Mar. 7, 2023, which is hereby incorporated by reference herein in its entirety.

What is claimed is:

1. A radiation detector in which a semiconductor substrate configured to convert incident radiation into charges, a circuit board on which a readout circuit configured to read out signals generated by a plurality of pixels arranged on the semiconductor substrate is arranged, and a bonding layer arranged between the semiconductor substrate and the circuit board and configured to bond the semiconductor substrate and the circuit board are stacked on each other, wherein
each of the plurality of pixels comprises an electrode arranged on a first surface on a side of the circuit board out of two principal surfaces of the semiconductor substrate,
the readout circuit is arranged on a second surface on a side of the semiconductor substrate out of two principal surfaces of the circuit board, and is electrically connected, via a first conductive member penetrating the circuit board, to a conductive pattern arranged on a third surface on an opposite side of the second surface out of the two principal surfaces, and
the electrode is electrically connected to the readout circuit via the conductive pattern and a second conductive member arranged in a through hole penetrating the circuit board and the bonding layer.

2. The detector according to claim 1, wherein the bonding layer comprises a first bonding layer arranged to cover the first surface and the electrodes, and a second bonding layer arranged between the first bonding layer and the circuit board.

3. The detector according to claim 2, wherein
each of the first bonding layer and the second bonding layer contains silicon oxide, and
the first bonding layer and the second bonding layer contact each other.

4. The detector according to claim 2, wherein
the bonding layer further comprises a third bonding layer arranged between the first bonding layer and the second bonding layer,
each of the first bonding layer and the second bonding layer contains silicon oxide, and
the third bonding layer contains silicon or a metal.

5. The detector according to claim 4, wherein the metal comprises aluminum.

6. The detector according to claim 1, wherein the semiconductor substrate contains CdZnTe.

7. The detector according to claim 1, wherein the semiconductor substrate contains at least one of CdTe, CdZnTe, $PbI_2$, $HgI_2$, $BiI_3$, or TlBr.

8. The detector according to claim 1, wherein a thickness of the semiconductor substrate is not larger than 3 mm.

9. The detector according to claim 1, wherein a thickness of the circuit board is not larger than 1.5 times a pitch at which the plurality of pixels are arranged.

10. The detector according to claim 1, wherein an aspect ratio of the through hole is not larger than 5.

11. The detector according to claim 1, wherein
a wiring layer comprising wiring patterns connected to the readout circuit is further stacked between the circuit board and the bonding layer, and
a length, to the first surface, from the wiring pattern closest to the first surface among the wiring patterns is not smaller than 100 nm.

12. The detector according to claim 1, wherein a thickness of the bonding layer is not smaller than 100 nm.

13. The detector according to claim 1, wherein the circuit board is a semiconductor substrate using a material different from the semiconductor substrate.

14. The detector according to claim 1, wherein an alignment mark used to bond the semiconductor substrate and the circuit board is arranged on the first surface.

15. The detector according to claim 1, wherein the radiation detector is electrically connected to an external device via a bump contacting a terminal arranged on the radiation detector.

16. The detector according to claim 1, wherein the radiation detector is electrically connected to an external device via an anisotropic conductive film contacting a terminal arranged on the radiation detector.

17. The detector according to claim 1, wherein the radiation detector is electrically connected to an external device via a wire contacting a terminal arranged on the radiation detector.

18. A radiation CT apparatus comprising:
the radiation detector according to claim 1;
a radiation generation unit configured to irradiate the radiation detector with radiation; and
a signal processing unit configured to process a signal output from the radiation detector.

* * * * *